United States Patent
Feng et al.

(10) Patent No.: US 8,584,063 B1
(45) Date of Patent: Nov. 12, 2013

(54) ASSERTION-BASED DESIGN PARTITIONING

(75) Inventors: Xiushan Feng, Austin, TX (US); Jayanta Bhadra, Austin, TX (US); Ross L. Patterson, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/606,980

(22) Filed: Sep. 7, 2012

(51) Int. Cl.
*G06F 17/50* (2006.01)
*G06F 11/22* (2006.01)

(52) U.S. Cl.
USPC .......................... 716/105; 716/106; 716/136

(58) Field of Classification Search
USPC .......................... 716/105, 106, 136
See application file for complete search history.

(56) References Cited

U.S. PATENT DOCUMENTS

| | | | | |
|---|---|---|---|---|
| 7,181,703 B1 * | 2/2007 | Borer et al. | ................... | 716/104 |
| 7,197,438 B1 * | 3/2007 | Mehta et al. | ...................... | 703/2 |
| 7,594,208 B1 * | 9/2009 | Borer et al. | ................... | 716/132 |
| 7,620,946 B2 | 11/2009 | Russell | ........... | 717/157 |
| 8,108,826 B2 | 1/2012 | Li et al. | ........... | 717/106 |
| 8,332,831 B1 * | 12/2012 | Metzgen | ....................... | 717/149 |
| 2010/0169607 A1 * | 7/2010 | Sutou | .............................. | 712/30 |

OTHER PUBLICATIONS

Vasudevan et al., "Improved verification of hardware designs through antecedent conditioned slicing," International Journal on Software Tools for Technology Transfer (STTT), vol. 9, No. 1, Feb. 2007, pp. 89-101.
Barros et al., "Assertion-based Slicing and Slice Graphs," SEFM '10 Proceedings of the 2010 8th IEEE International Conference on Software Engineering and Formal Methods, Sep. 2010, pp. 93-102.
Chung et al., "Program Slicing Based on Specification," 2001 Symposium on Applied Computing (SAC '01), Mar. 2001, pp. 605-609.
Vedula et al., "Program Slicing for ATPG-Based Property Checking," VLSID '04 Proceedings of the 17th International Conference on VLSI Design, Jan. 2004, pp. 591-596.

* cited by examiner

*Primary Examiner* — Stacy Whitmore
*Assistant Examiner* — Magid Dimyan
(74) *Attorney, Agent, or Firm* — VanLeeuwen & VanLeeuwen; David Dolezal

(57) ABSTRACT

An approach is provided in which a computing system retrieves a design description that corresponds to an electronic circuit design. The computing system selects an assertion corresponding to the electronic circuit design, which includes one or more assertion signal identifiers corresponding to one or more description signal points included in the design description. Next, the computing system creates a partitioned region from the design description based upon the description signal points. The computing system compiles and verifies the partitioned region that, in turn, verifies the electronic circuit design.

18 Claims, 10 Drawing Sheets

400

```
always @(mux_mode or alt_out or alt_obe)
  begin : SELECT_MUX                          — 410
    case (mux_mode)
      4'b0000 : begin
        pad_obe_reg   = alt_obe[0];
        pad_out_reg   = alt_out[0];
      end
      4'b0001 : begin
        pad_obe_reg   = alt_obe[1];
        pad_out_reg   = alt_out[1];
      end
      4'b0010 : begin
        pad_obe_reg   = alt_obe[2];
        pad_out_reg   = alt_out[2];
      end
      4'b0011 : begin
        pad_obe_reg   = alt_obe[3];
        pad_out_reg   = alt_out[3];
      end
      4'b0100 : begin
        pad_obe_reg   = alt_obe[4];
        pad_out_reg   = alt_out[4];
      end
      4'b0101 : begin
        pad_obe_reg   = alt_obe[5];
        pad_out_reg   = alt_out[5];
      end
      4'b0110 : begin
        pad_obe_reg   = alt_obe[6];
        pad_out_reg   = alt_out[6];
      end
      4'b0111 : begin
        pad_obe_reg   = alt_obe[7];
        pad_out_reg   = alt_out[7];
      end
      4'b1000 : begin
        pad_obe_reg   = alt_obe[8];
        pad_out_reg   = alt_out[8];

end // block: SELECT_MUX
```

FIG. 4

ASSERTION-BASED DESIGN PARTITIONING

TECHNICAL FIELD

The present disclosure relates to reducing an electronic circuit design's verification time by identifying and verifying assertion-based partitioned regions within the electronic circuit design's design description.

BACKGROUND

Electronic circuit design involves several steps, such as system-level design, design description conversion/verification, and physical design. System-level design involves creating a functional specification, which may utilize a variety of languages and tools such as C/C++ models, Transaction Level Models (TLM), etc. The design description conversion/verification process, commonly known as register transfer level (RTL) design and verification, converts the functional specification into a description that describes the behavior of the electronic circuit as well as the electronic circuit's input and output interconnections. This process involves verifying a compiled version of the design description to ensure proper design behavior. The physical design process uses the design description to create the physical electronic circuit, which includes gate identification, placement, and wiring.

BRIEF DESCRIPTION THE SEVERAL VIEWS OF THE DRAWINGS

The present disclosure may be better understood, and its numerous objects, features, and advantages made apparent to those skilled in the art by referencing the accompanying drawings, wherein:

FIG. 4 is a diagram showing an example of a design description that includes a condition statement;

DETAILED DESCRIPTION

This disclosure reduces the verification time of a design description conversion/verification process by creating, compiling, and verifying partitioned regions of a design description based upon assertions. As a result, by focusing verification on a "subset" of the design description, verification time decreases and overall verification quality increases by targeting essential regions within the design description.

The following detailed description will generally follow the summary of the disclosure, as set forth above, further explaining and expanding the definitions of the various aspects and embodiments of the disclosure as necessary.

Figure 1:
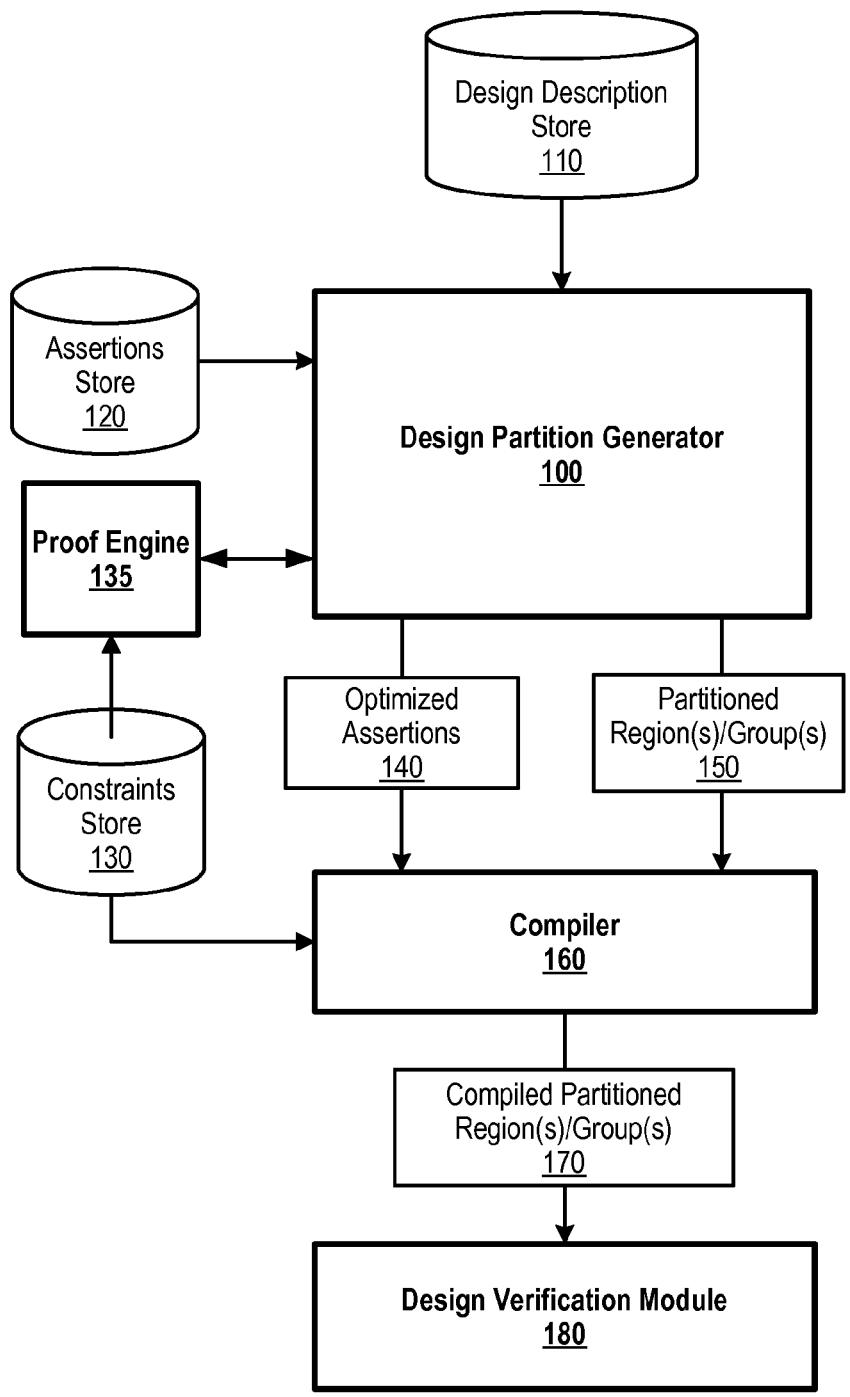
FIG. 1 is a diagram showing a design partition generator that partitions a design description based upon assertions in order to reduce verification test time.

FIG. 1 is a diagram showing a design partition generator that partitions a design description based upon assertions in order to reduce verification test time. Although this disclosure partitions a design description by removing software description statements and software description modules from a design description, several figures in this disclosure are shown and discussed in a "hardware-based" context as opposed to a "software-based" context in order to visually illustrate the identification and reduction of corresponding circuit logic within the electronic circuit design that does not require verification. As those skilled in the art can appreciate, description statements may be lines within a design description and a design module may be a group of lines within a design description.

Design partition generator 100 retrieves a design description (e.g., an RTL file) from design description store 110, and retrieves assertions from assertions store 120. The design description describes an electronic circuit design (e.g., in a hardware description language) and the assertions are monitors that detect unwanted behavior and/or create alerts for desired behavior. In one embodiment, the assertions may include conditional statements to monitor specific behaviors and display messages accordingly. As those skilled in the art can appreciate, design partition generator 100 may be a computing system such as information handling system 900 shown in FIG. 9.

Each assertion includes one or more assertion signal identifiers (e.g., signal "xyz"). Design partition generator 100 analyzes the assertions and maps the assertion signal identifiers to description signal points included in the design description. For example, an assertion may monitor a counter's functionality and include assertion signal identifiers that correspond to the counter's input and output signals described in the design description.

Figure 2:
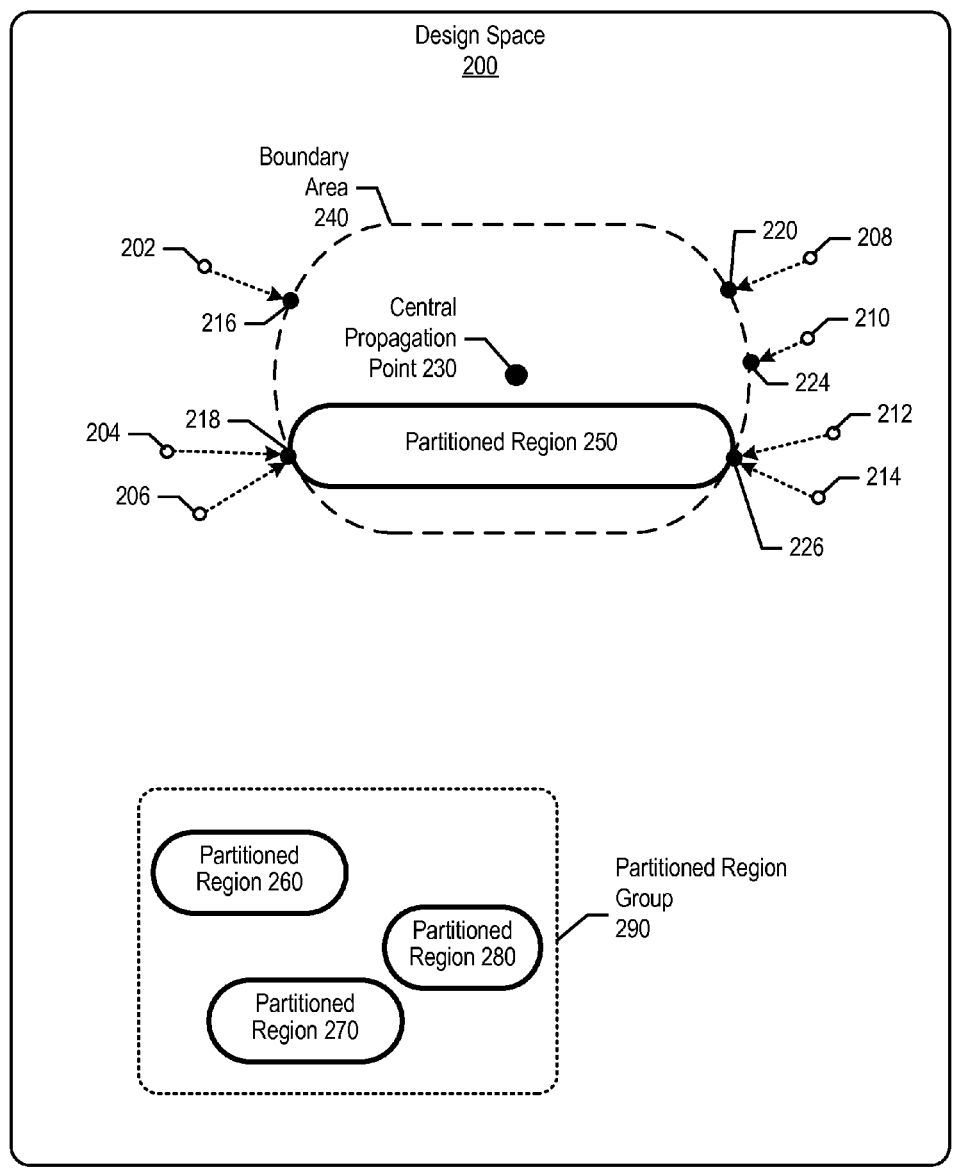
FIG. 2 is a diagram showing a spatial illustration of reducing an electronic circuit design's verification area through signal propagation and conditional statement analysis.

Design partition generator 100 identifies a central propagation point of the mapped description signal points, and propagates the description signal points towards the central propagation point according to propagation rules (e.g., point 202 propagated to point 216 in FIG. 2). In one embodiment, the propagation rules may include a state stage rule and an equivalence rule. The state stage rule specifies that a signal may not propagate across a "state stage," which corresponds to a clock cycle of the electronic circuit design (e.g., a latch or flop). The equivalence rule specifies signal equivalency and reachability such that signal A may be replaced by signal A' in order to remove unused logic between the two signals (see FIGS. 2, 3 and corresponding text for further details).

Design partition generator 100 propagates the signal points according to the propagation rules to "boundary points" that, in one embodiment, are points at which the signals may no longer be propagated based upon the propagation rules (e.g., reaching a latch input or output). Design partition generator 100 identifies a boundary area corresponding to the boundary points and identifies "conditions" within the boundary area (see FIG. 5 and corresponding text for further details). Conditions may be viewed as "multiplexers" from a hardware-based context. From a software-based context, conditions may include condition statements that select an input, from multiple inputs, as an output based upon a condition selection input value. Design partition generator 100 analyzes the condition statements and creates symbolic expressions for the condition statements' condition selection inputs, which are sent to proof engine 135.

Proof engine 135 uses constraints from constraints store 130 to determine whether the condition constantly selects a particular input or inputs as its output (e.g., constantly selects input "1"). In one embodiment, constraints may include "assume" type of assertions. For example, using a System-Verilog Assertion (SVA) language, a constraint written as an assumption may be "assume property (@(clock) ~bs_s-can_enable && ~jtg_shift_enable)." In this example, the assumption requires both "bs_scan_enable" and "jtp_shift_enable" to be "0" during an entire formal verification process in order to pass verification.

When proof engine 135 provides results that indicate the condition constantly selects the same input under the constraints, design partition generator 100 removes description modules/statements corresponding to the unused inputs from the boundary area. Once design partition generator 100 removes the corresponding unused description modules and description statements from the boundary area, design partition generator 100 defines the remaining boundary area as a "partitioned region," which is the region within the design description that the assertion verifies (see FIG. 2 and corresponding text for further details).

In one embodiment, design partition generator 100 may create multiple partitioned regions, each corresponding to a different assertion. In another embodiment, design partition generator 100 may combine multiple partitioned regions into "partitioned region groups" in order to efficiently verify the electronic circuit design (see FIG. 2 and corresponding text for further details).

Figure 7:
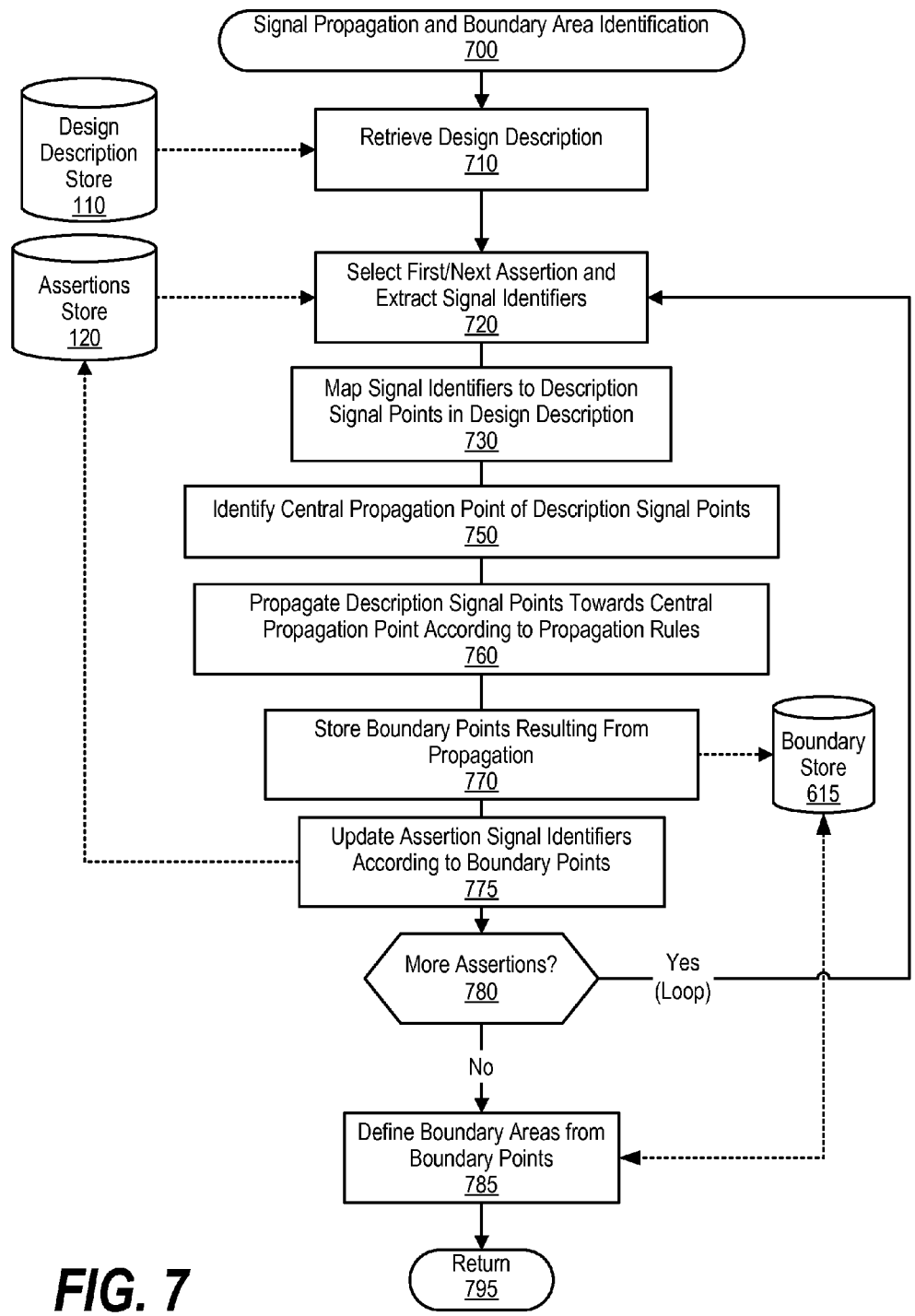
FIG. 7 is a flowchart showing steps taken in propagating signals corresponding to assertions towards a central propagation point and identifying boundary areas for the assertions.
Figure 8:
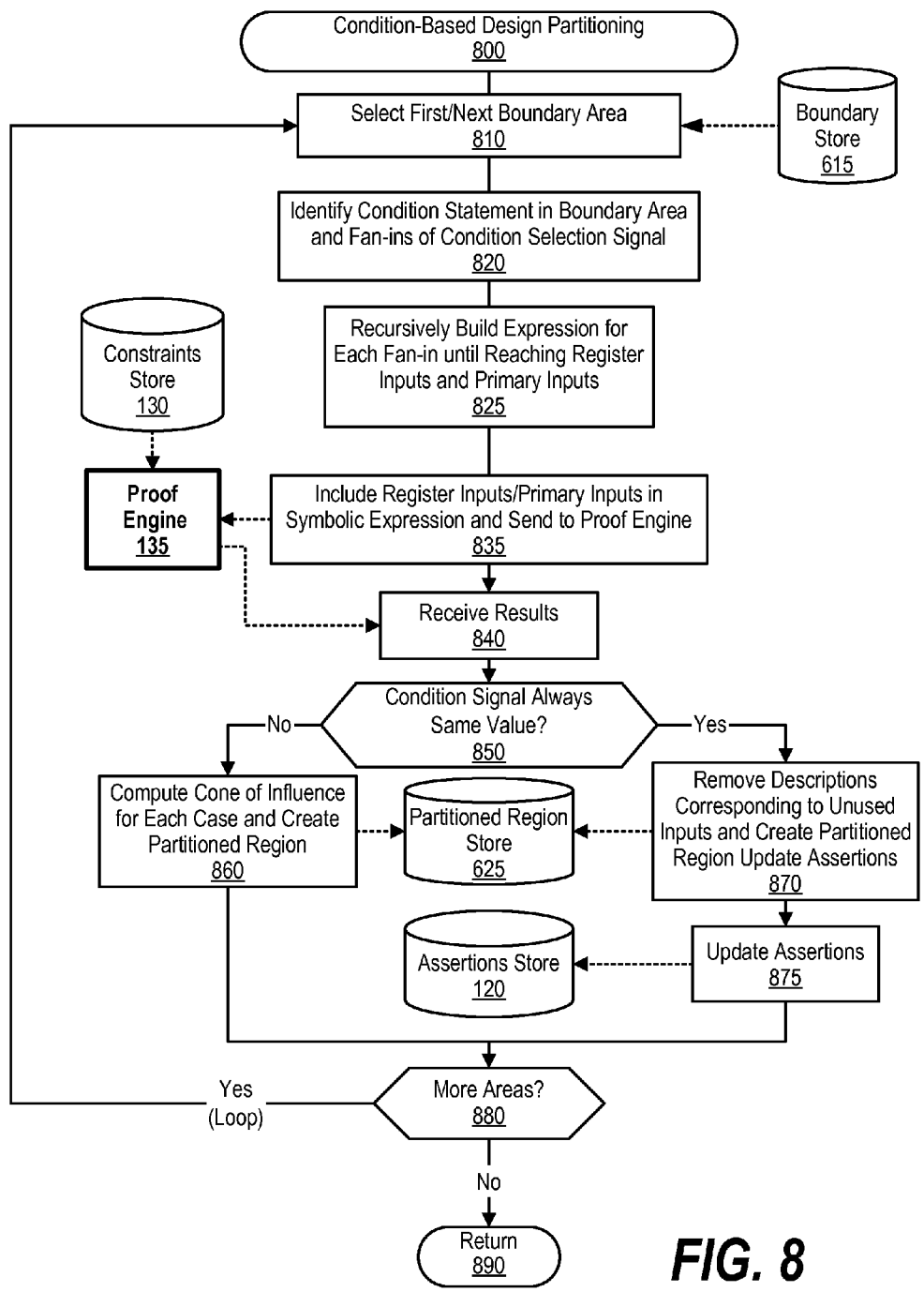
FIG. 8 is a flowchart showing steps taken in removing description modules and/or description statements associated with non-selected condition statement inputs.

Design partition generator 100 updates the assertions during signal propagation steps and condition analysis steps by replacing assertion signal identifiers with different, but equivalent, assertion signal identifiers that correspond to the boundary points and/or constantly selected conditions (see FIGS. 7, 8, and corresponding text for further details).

Design partition generator 100 sends optimized assertions 140 and partitioned regions/groups 150 to compiler 160, which compiles them into compiled partitioned regions/groups 170 based upon constraints from constraints store 130. The constraints may include, for example, register values and/or primary input values. In one embodiment, as those skilled in the art can appreciate, "compiling" the partitioned regions, assertions, and constraints is a process that a parser may perform, which builds an internal representation (e.g., design database) of the partitioned regions in a machine-recognizable format. The compiled partition regions include assertions that monitor the partitioned regions according to constraints placed on the design description. In another embodiment, compiler 160 may create compiled partitioned regions/groups 170 as an executable program.

In turn, design verification module 180 verifies compiled partitioned regions/groups 170. In one embodiment, as those skilled in the art can appreciate, the verification process involves verification module 180 invoking compiled partitioned regions/groups 170 and evaluating whether the assertions hold true according to the constraints under various test conditions. In one embodiment, the v When design verification module 180 successfully verifies compiled partitioned regions/groups 170, design verification module 180 successfully verifies the entire design description and, as a result, successfully verifies the entire electronic circuit design.

FIG. 2 is a diagram showing a spatial illustration of reducing an electronic design's verification area through signal propagation and conditional statement analysis. Design space 200 represents a design description's electronic circuit design area. Design partition generator 100 maps assertion signal identifiers to description signal points 202, 204, 206, 208, 210, 212, and 214 (e.g., input and output signals in the electronic circuit design). In turn, design partition generator 100 identifies central propagation point 230, which is a point that is in proximity to a central location of description signal points 202-214.

In one embodiment, central propagation point 230 may be a signal or a module boundary towards which to propagate the description signal points. In another embodiment, central propagation point 230 may be a point with similar distances away from description signal points 202, 204, 206, 208, 210, 212, and 214 (e.g., number of logic gates). In this embodiment, central propagation point 230 may correspond to an actual gate, a logic block, or a description module.

Next, design partition generator 100 propagates the description signal points towards central propagation point 230 until the description signal points may no longer be propagated according to propagation rules, such as reaching a state stage (e.g., a latch). Design partition generator 100 defines these "propagation ending points" as boundary points 216, 218, 220, 224, and 226.

From a software-based perspective (e.g., the design description that corresponds to design space 200), signal propagation through the design description may include proving signal equivalence (e.g., through a design module) based on wire assignments, port connections, logic equivalence, and etcetera. In one embodiment, a signal may be forward propagated using abstraction techniques such as applying "cutpoints" to input signals of partitioned regions. A cutpoint is a point inside a design at which driving logic is removed in order for the cutpoint to become a primary input.

Design partition generator 100 defines boundary area 240 based upon boundary points 216-226 and evaluates boundary area 240 for conditions (e.g., "multiplexers" in a hardware-based context, "condition statements" in a software-based context). Design partition generator 100 analyzes the conditions and removes logic (description modules/statements) from boundary area 240 associated with unused condition inputs, resulting in partitioned region 250 (see FIGS. 5, 8, and corresponding text for further details). Partitioned region 250 includes the logic representation that an assertion requires for verification. As those skilled in the art can appreciate, partitioned region 250 corresponds to description modules/statements in the design description that require verification by the assertion.

FIG. 2 also shows partitioned regions 260, 270, and 280 that design partition generator 100 defined based upon other assertions. In one embodiment, design partition generator 100 may group partitioned regions 260-280 into partitioned region group 290 and verify partitioned region group 290 as a whole. Although such grouping may increase the overall amount of logic representation (description statements) to verify, the grouping may reduce overall verification time compared with testing each of partitioned regions 260-280 individually.

In one embodiment, design partition generator 100 balances partitioning complexity with verification efficiency when determining whether to group partitioned regions. For example, in an environment that includes twenty-five thousand assertions, design partition generator 100 may create four to five partitioned region groups. In this example, each partitioned region group may include partitioned regions that target similar design areas (e.g., timing logic, busses, etc.). In turn, the four to five "sub-designs" are compiled and verified separately (e.g., concurrently) in order to improve runtime verification performance.

Figure 3:
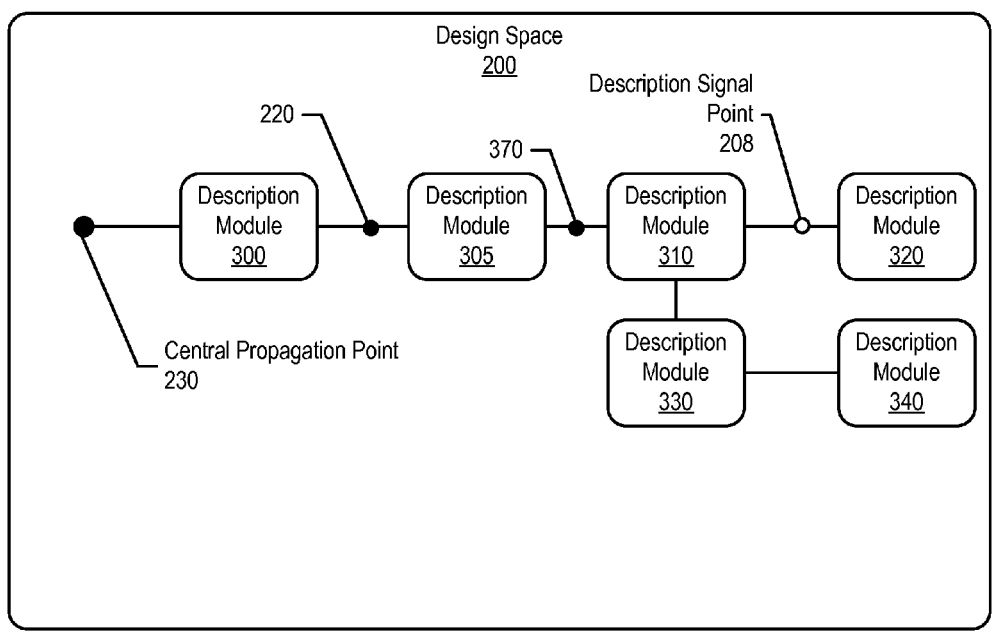
FIG. 3 is a diagram showing an example of a design partition generator propagating description signal points through a design in order to remove description logic not utilized by an assertion.

FIG. 3 is a diagram showing an example of a design partition generator propagating description signal points through a design in order to remove description modules not utilized by an assertion.

Design partition generator 100 maps an assertion signal's signal identifier to description signal point 208 and identifies central propagation point 230 as a centrally located propagation point (see FIG. 2 and corresponding text for further details). Since central propagation point 230 is to the "left" of description signal point 208, design partition generator 100 evaluates description module 310 and determines that description signal point 208 is equivalent to signal point 370. For example, a design description may include description modules that include statements "assign A=B" and "assign B=C." In this example, equivalence relations are transitive and symmetric such that A=C and C=A (signals 208 and 370 may be signal A, B, or C this example). Design partition generator 100 performs the same analysis on description module 305 and concludes that signal 370 is equivalent to signal point 220.

However, when design partition generator 100 evaluates description module 300, design partition generator 100 determines that signal point 220 may not be propagated "behind" description logic 300 due to, for example, latches or logic gates that change the properties of signal point 220. As such, design partition generator 100 identifies signal point 220 as boundary point 220. In turn, design partition generator 100 removes description modules 305, 310, 320, 330, and 340 from verification consideration (assuming no other assertions require such description logic).

From a software-based perspective (e.g., the design description that corresponds to design space 200), signal propagation through the design description may include proving signal equivalence based on wire assignments, port connections, logic equivalence, and etcetera. During the propagation process, design partition generator 100 also updates assertion signal identifiers accordingly. For example, for the assertion "assert property a && b|=>c," assume that the original location of "c" is outside a design module where "a" and "b" exist. The design description may state that signal "c" is equivalent to signal "d," where "d" is inside the same design module as "a" and "b". As such, based on the propagation rules, signal "c" is backward propagated to signal "d" and the assertion is updated to "assert property a && b|=>d."

In one embodiment, a signal may be forward propagated using abstraction techniques such as applying "cutpoints" to input signals of partitioned regions. A cutpoint is a point inside a design at which driving logic is removed in order for the cutpoint to become a primary input. Cutpoint insertion is a conservative abstraction technique such that when an assertion is proven to be true using a cutpoint, the assertion is true with the original design. However, when an assertion is proven to be false using a cutpoint, the assertion maybe actually be true with the original design. As such, in this embodiment, the driving logic of cutpoints may be added back into the verification process to resolve "false-prove" situations.

FIG. 4 is a diagram showing an example of a design description that includes a condition statement. Code 400 includes condition statement 410, which includes a "mux_mode" condition selection signal whose value selects a particular input as an output. The design partition generator recursively traces the mux-mode signal back to a register and/or primary input that corresponds to a constraint and creates a symbolic expression accordingly (see FIGS. 5, 8, and corresponding text for further details for a logical representation of condition statement analysis).

The design partition generator then sends the symbolic expression to a proof engine that determines whether the mux_mode signal produces a constant value (e.g., 4'b0000). If so, the design partition generator removes design modules/statements that correspond to the condition statement's unused inputs.

Figure 5:
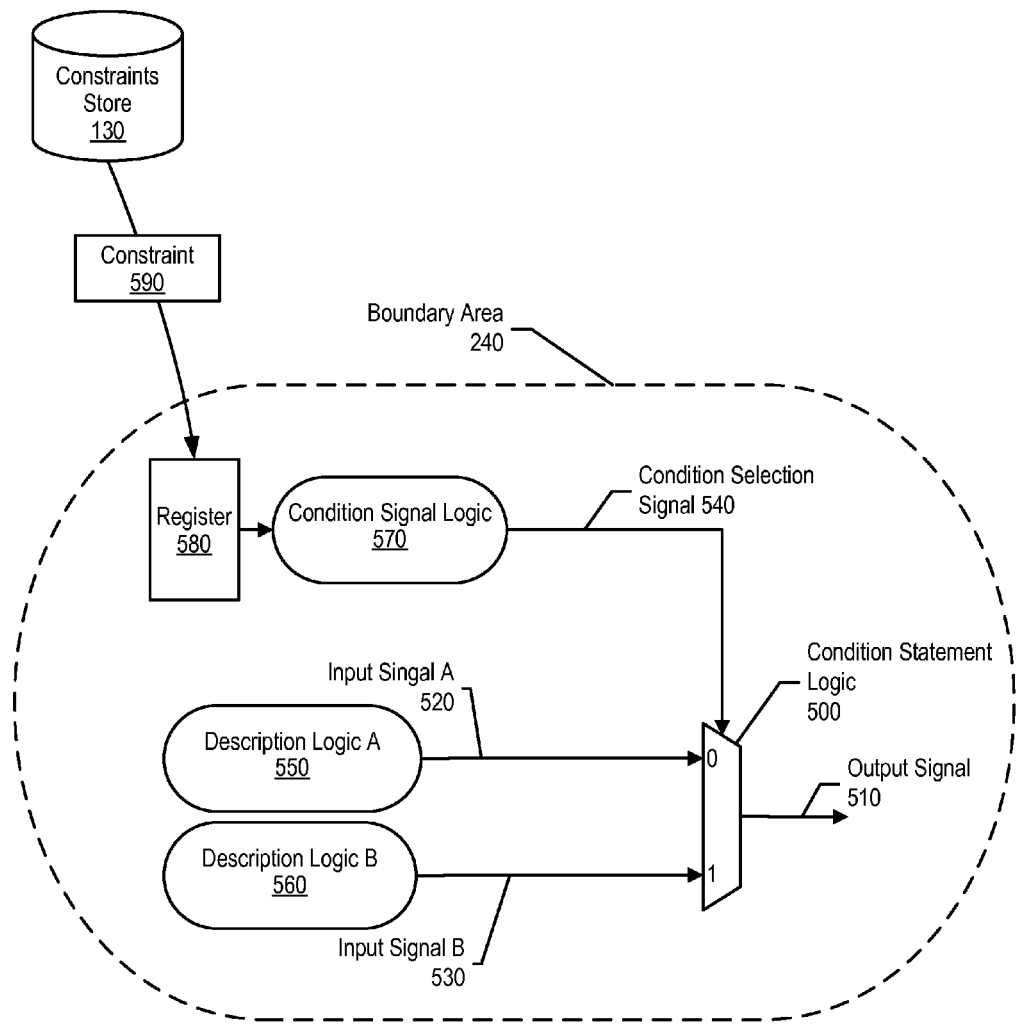
FIG. 5 is a diagram showing a hardware-based representation of a design partition generator identifying a condition statement that receives a constant value on a condition selection signal.

FIG. 5 is a diagram showing a hardware-based representation of a condition statement that receives a constant value on a condition selection signal. When boundary area 240 includes a condition statement (represented by condition statement logic 500), design partition generator 100 determines whether the condition statement constantly receives a condition selection input value that selects the same input(s) as an output. If so, design partition generator 100 removes description modules/statements corresponding to the unutilized inputs.

Referring to FIG. 5, design partition generator 100 identifies condition selection signal 540, which selects either input signal A 520 or input signal B 530 as an output (output signal 510). As such, design partition generator 100 recursively traces condition selection signal 540 back through condition selection logic 570 to register(s) 580 (or primary inputs) and identifies a value of constraint(s) 590 targeted for register(s) 580. Design partition generator 100 builds a symbolic expression using register(s) 580 (or primary inputs) and sends the symbolic expression to a proof engine (see FIG. 8 and corresponding text for further details).

The proof engine proceeds through a series of proofs to determine whether condition selection signal 540 constantly produces the same value (e.g., "0" or "1"). If so, design partition generator 100 removes description statements that correspond to the unused input. Referring to FIG. 5, if condition selection signal 540 constantly generates a "0", then design partition generator 100 removes description logic B 560 (description modules/statements corresponding to input signal B 530) from boundary area 240 and keeps description logic A 550 (e.g., output signal 510 and input signal 520 A are directly connected).

In one embodiment, condition statement logic 500 may include more than two inputs. In this embodiment, design partition generator 100 removes design statements corresponding to each unused input. For example, if condition statement logic 500 includes five inputs and condition selection signal 540 selects two of the five inputs, design partition generator 100 removes description statements from boundary area 240 that correspond to the three unused inputs (see FIG. 8 and corresponding text for further details).

Figure 6:
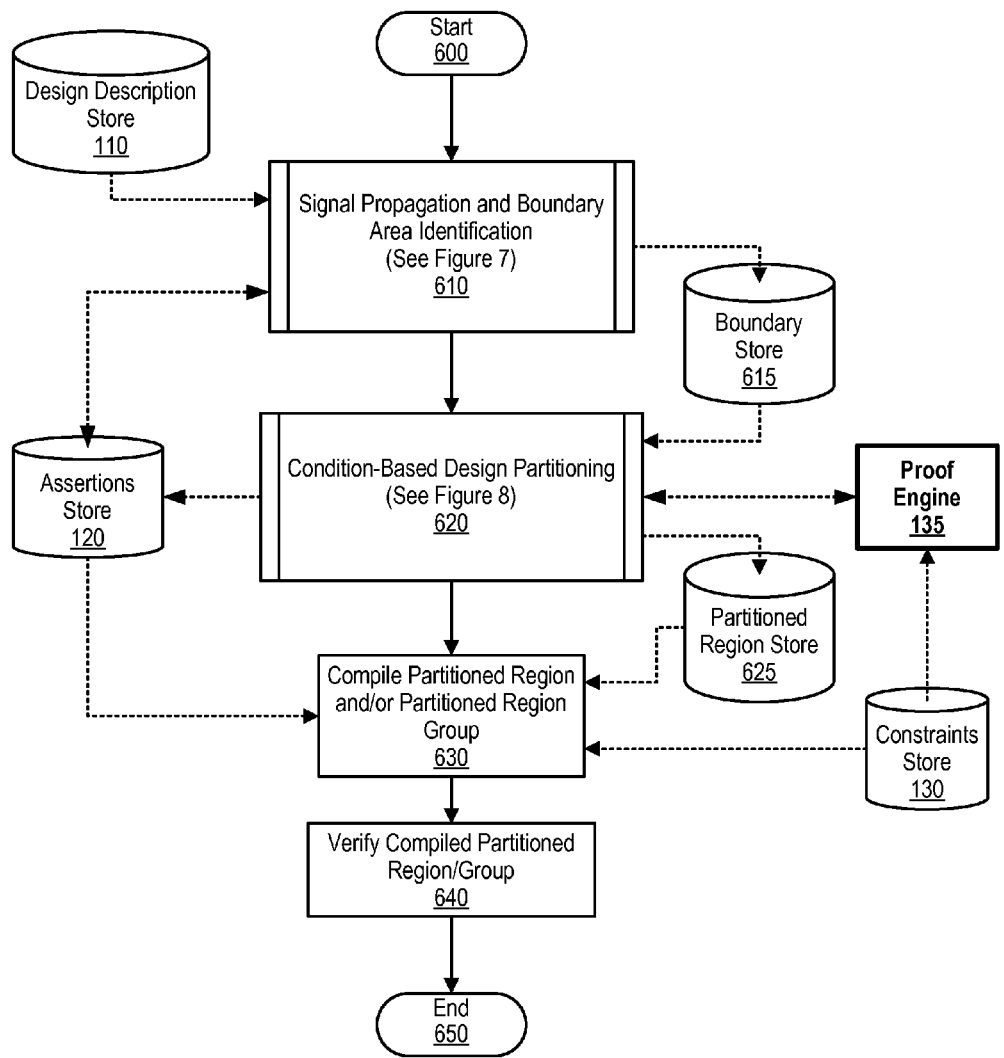
FIG. 6 is a high-level flowchart showing steps taken in partitioning a design description and optimizing assertions to verify compiled partitioned regions and/or compiled partitioned region groups.

FIG. 6 is a high-level flowchart showing steps taken in creating partitioned regions and optimizing assertions to verify compiled partitioned regions and/or compiled partitioned region groups.

Processing commences at 600, whereupon processing retrieves a design description from design description store 110 (e.g., an RTL file) and assertions from assertions store 120. Processing uses assertion signal identifiers included in the assertions to identify description signal points in the design description and propagate the description signal points towards a central propagation point based upon propagation rules. Once processing finishes propagating the description signal points to boundary points, processing stores boundary point identifiers corresponding to the boundary points in boundary store 615 and defines a corresponding boundary area (pre-defined process block 610, see FIG. 7 and corresponding text for further details).

Processing analyzes the boundary areas for condition statements, which are statements that include multiple inputs, an output, and a condition selection input (pre-defined process block 620, see FIG. 8 and corresponding text for further details). Processing then recursively traces back the condition selection input to register inputs and/or primary inputs and builds a symbolic expression that includes identifiers corresponding to the register inputs/primary inputs. Proof engine 135 proves the symbolic expression using constraints retrieved from constraints store 130 and informs processing as to whether the condition selection signal constantly produces the same value (e.g., selecting input "4"). If so, processing removes description modules/statements from the boundary area, thus further reducing the amount of required verification area. In turn, processing stores the reduced (partitioned) boundary areas as partitioned regions in partitioned region store 625 and updates the assertions' assertion signal identifiers accordingly to test the partitioned design description.

Processing compiles the partitioned regions and/or partitioned region groups with constraints from constraints store 130 and the updated assertions at step 630. In one embodiment, as those skilled in the art can appreciate, "compiling" the partitioned regions/groups and assertions is a process that a parser performs to build an internal representation (e.g., design database) of the partitioned regions in a machine-recognizable format. The compiled partition regions include assertions that monitor the partitioned regions according to constraints placed on the design description.

At step 640, processing verifies the compiled partitioned regions, such as through formal verification methods. In one embodiment, as those skilled in the art can appreciate, the verification process involves verification module 180 invoking the compiled partitioned regions/groups and evaluating whether the assertions hold true under various constraints and test conditions. Processing ends at 650.

FIG. 7 is a flowchart showing steps taken in propagating signals associated with assertions towards a central propagation point and identifying boundary areas for the assertions (e.g., pre-defined process block 610 from FIG. 6).

Processing commences at 700, whereupon processing retrieves a design description from design description store 110 that describes an electronic circuit design (step 710). At step 720, processing selects a first assertion corresponding to the electronic circuit design from assertions store 120, and extracts assertion signal identifiers from the assertion. The assertion is designed to monitor a particular area of the design description for appropriate behavior and includes one or more assertion signal identifiers.

Processing maps the assertion signal identifiers to description signal points in the design description at step 730 (e.g., searches the design description for signal names that match the assertion signal identifiers). At step 750, processing analyzes the mapped description signal points and identifies a central propagation point, such as central propagation point 230 shown in FIG. 2. Several approaches may be taken to identify the central propagation point and may be defined for each assertion or a group of assertions. In an embodiment that includes multiple assertions, central propagation points may be defined for each assertion. In this embodiment, when the number of assertions is large, assertion groups may be defined to partition the assertions into a few partitioned region groups in order to avoid complexities of computing central propagation points for each assertion.

In one embodiment, the central propagation point may be a signal or a module boundary towards which to propagate the description signal points. In another embodiment, a central propagation point may be a point with similar distances away from the description signal points (e.g., number of logic gates). In this embodiment, the central propagation point may be defined as an actual gate, a logic block, or an actual module. Processing propagates the description signal points towards the central propagation point according to propagation rules at step 760, such as staying within a state stage area (e.g., not crossing over a latch, see FIG. 3 and corresponding text for further details).

After processing determines that propagation is complete, processing identifies and stores boundary points in boundary store 615 at step 770. At step 775, processing updates the selected assertion's assertion signal identifiers with different assertion signal identifiers that correspond to the boundary points.

A determination is made as to whether there are more assertions to evaluate (decision 780). If there are more assertions to evaluate, decision 780 branches to the "Yes" branch, whereupon processing loops back to select and evaluate the next assertion. This looping continues until there are no more assertions to evaluate, at which point decision 780 branches to the "No" branch and processing defines boundary areas based upon the boundary points stored in boundary store 615 (step 785). In one embodiment, processing creates a separate boundary area for each assertion's corresponding boundary points. Processing returns at 795.

FIG. 8 is a flowchart showing steps taken in removing description modules and/or description statements associated with non-selected condition statement inputs. Processing commences at 800, whereupon processing selects a first boundary area from boundary store 615 at step 810. Next, at step 820, processing identifies a condition statement included in the boundary area and fan-ins of the condition statement's condition selection signal (see FIG. 5 and corresponding text for further details).

Processing, at step 825, recursively builds an expression for each fan-in, working "backwards" towards register inputs and/or primary inputs (step 825). In one embodiment, processing builds a symbolic expression for a "cone of influence" at this step. As those skilled in the art can appreciate, building a symbolic expression for a cone of influence involves identifying circuitry/logic that drives the condition selection signal (e.g., if cond=a && b, a=ln 0^ln 1, b=Reg1||Reg2, then, the symbolic expression for cond is (ln 0^ln 1) && (Reg1||Reg2)).

At step 835, processing includes register input identifiers and primary input identifiers in a symbolic expression and sends the symbolic expression to proof engine 135. Proof engine 135 retrieves constraints from constraints store 130 and proves the symbolic expression. For example, using the symbolic expression "cond=(ln 0^ln 1) && (Reg1||Reg2)" and constraints of "ln 0==0 && ln 1==0," proof engine 135 may prove that "cond" is a constant value of "0."

Processing receives the results from proof engine 135 at step 840, and a determination is made as to whether the condition selection signal value is constant throughout the proof, such as constantly selecting input "4" (decision 850). If the condition signal value is constant, decision 850 branches to the "Yes" branch, whereupon processing partitions the design description at step 870 by removing description modules/statements corresponding to non-selected condition inputs from the boundary area, and stores the partitioned design description as a partitioned region in partitioned region store 625. Processing also updates the assertions at step 875 (e.g., updates the assertion signal identifiers) in assertions 120 and removes assertions and/or assertion signal identifiers corresponding to non-selected condition inputs.

On the other hand, if the results from proof engine 135 do not indicate that the condition selection signal is a constant value, decision 850 branches to the "No" branch, whereupon processing computes a cone of influence for each input signal and includes them in an partitioned region that is stored in partitioned file 625 (step 860). A determination is made as to whether there are any more boundary areas to analyze (decision 880). If there are more boundary areas to analyze, decision 880 branches to the "Yes" branch, whereupon processing loops back to select the next boundary area. This looping continues until there are no more boundary areas to analyze, at which point decision 880 branches to the "No" branch, whereupon processing returns at 890.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, a software embodiment (including firmware, resident software, micro-code, etc.), including processing circuitry for executing thereof, or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program, in a non-transitory fashion, for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 9:
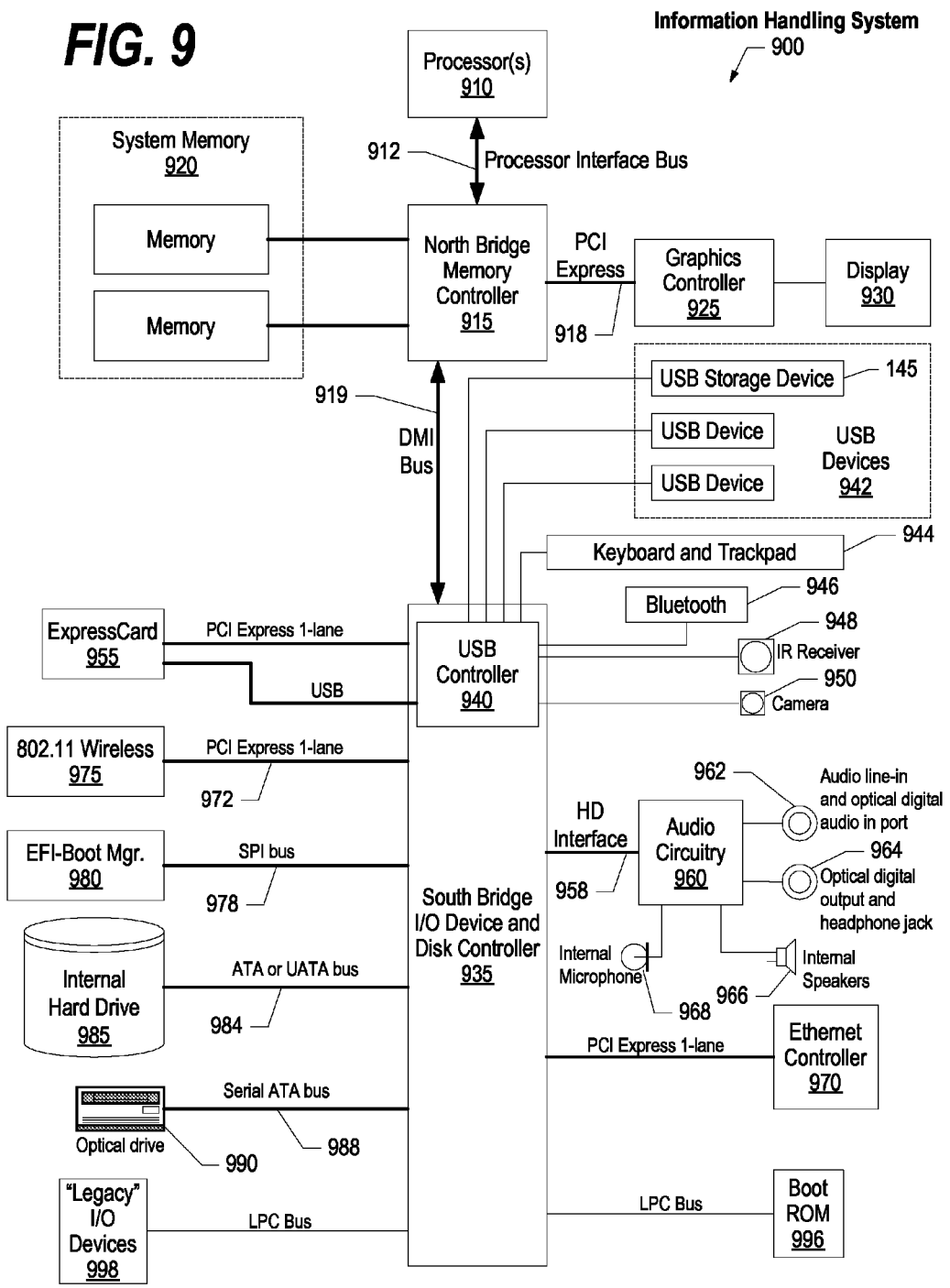
FIG. 9 is a block diagram of a data processing system in which the methods described herein can be implemented.

FIG. 9 illustrates information handling system 900, which is a simplified example of a computer system capable of performing the computing operations described herein. Information handling system 900 includes one or more processors 910 coupled to processor interface bus 912. Processor interface bus 912 connects processors 910 to Northbridge 915, which is also known as the Memory Controller Hub (MCH). Northbridge 915 connects to system memory 920 and provides a means for processor(s) 910 to access the system memory. Graphics controller 925 also connects to Northbridge 915. In one embodiment, PCI Express bus 918 connects Northbridge 915 to graphics controller 925. Graphics controller 925 connects to display device 930, such as a computer monitor.

Northbridge 915 and Southbridge 935 connect to each other using bus 919. In one embodiment, the bus is a Direct Media Interface (DMI) bus that transfers data at high speeds in each direction between Northbridge 915 and Southbridge 935. In another embodiment, a Peripheral Component Interconnect (PCI) bus connects the Northbridge and the Southbridge. Southbridge 935, also known as the I/O Controller Hub (ICH) is a chip that generally implements capabilities that operate at slower speeds than the capabilities provided by the Northbridge. Southbridge 935 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 996 and "legacy" I/O devices (using a "super I/O" chip). The "legacy" I/O devices (998) can include, for example, serial and parallel ports, keyboard, mouse, and/or a floppy disk controller. The LPC bus also connects Southbridge 935 to Trusted Platform Module (TPM) 995. Other components often included in Southbridge 935 include a Direct Memory Access (DMA) controller, a Programmable Interrupt Controller (PIC), and a storage device controller, which connects Southbridge 935 to nonvolatile storage device 985, such as a hard disk drive, using bus 984.

ExpressCard 955 is a slot that connects hot-pluggable devices to the information handling system. ExpressCard 955 supports both PCI Express and USB connectivity as it connects to Southbridge 935 using both the Universal Serial Bus (USB) the PCI Express bus. Southbridge 935 includes USB Controller 940 that provides USB connectivity to devices that connect to the USB. These devices include webcam (camera) 950, infrared (IR) receiver 948, keyboard and trackpad 944, and Bluetooth device 946, which provides for wireless personal area networks (PANs). USB Controller 940 also provides USB connectivity to other miscellaneous USB connected devices 942, such as a mouse, removable nonvolatile storage device 945, modems, network cards, ISDN connectors, fax, printers, USB hubs, and many other types of USB connected devices. While removable nonvolatile storage device 945 is shown as a USB-connected device, removable nonvolatile storage device 945 could be connected using a different interface, such as a Firewire interface, etcetera.

Wireless Local Area Network (LAN) device 975 connects to Southbridge 935 via the PCI or PCI Express bus 972. LAN device 975 typically implements one of the IEEE 802.11 standards of over-the-air modulation techniques that all use the same protocol to wireless communicate between information handling system 900 and another computer system or device. Optical storage device 990 connects to Southbridge 935 using Serial ATA (SATA) bus 988. Serial ATA adapters and devices communicate over a high-speed serial link. The Serial ATA bus also connects Southbridge 935 to other forms of storage devices, such as hard disk drives. Audio circuitry 960, such as a sound card, connects to Southbridge 935 via bus 958. Audio circuitry 960 also provides functionality such as audio line-in and optical digital audio in port 962, optical digital output and headphone jack 964, internal speakers 966, and internal microphone 968. Ethernet controller 970 connects to Southbridge 935 using a bus, such as the PCI or PCI Express bus. Ethernet controller 970 connects information handling system 900 to a computer network, such as a Local Area Network (LAN), the Internet, and other public and private computer networks.

While FIG. 9 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

Figure 10:
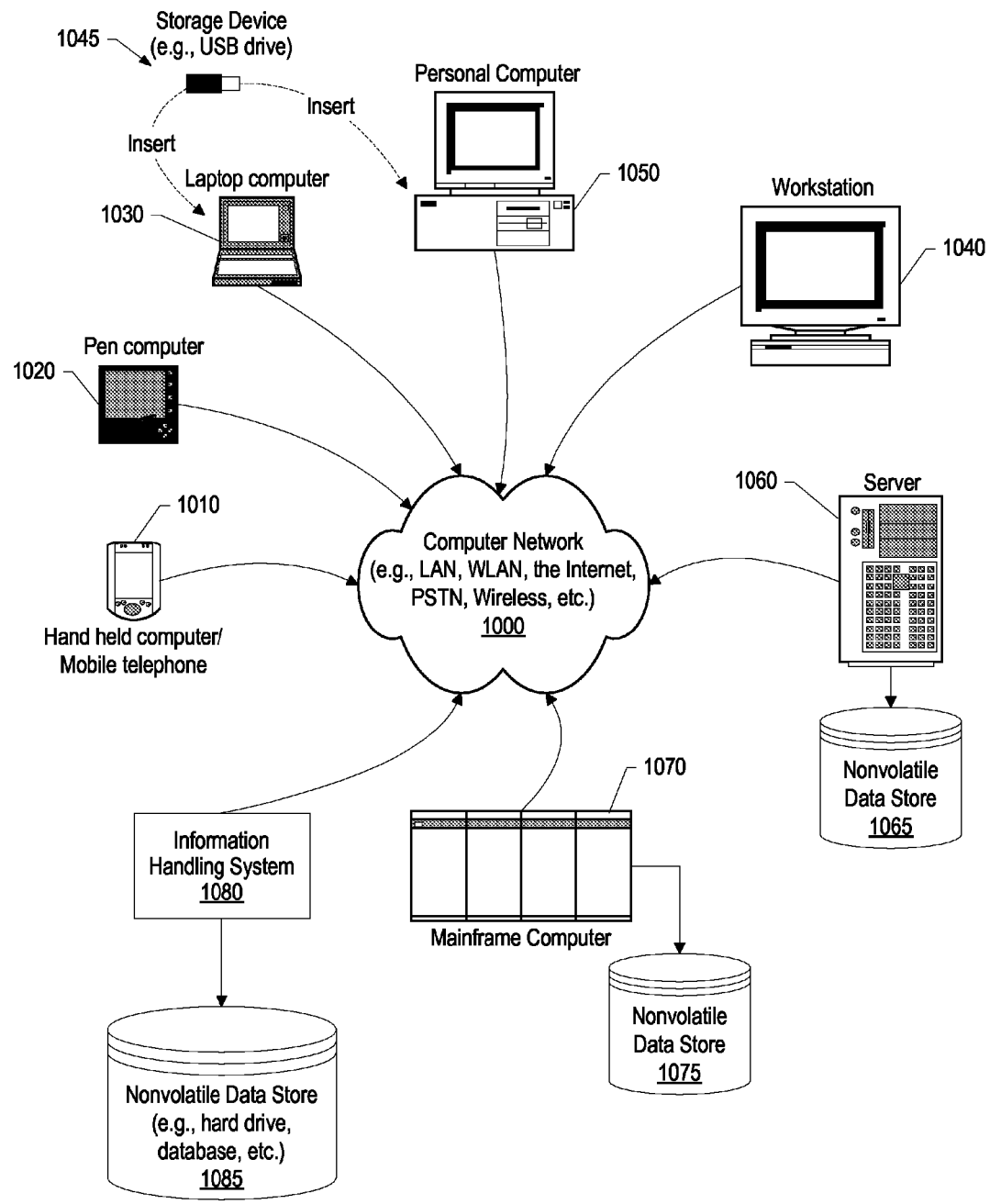
FIG. 10 provides an extension of the information handling system environment shown in FIG. 9 to illustrate that the methods described herein can be performed on a wide variety of information handling systems which operate in a networked environment.

FIG. 10 provides an extension of the information handling system environment shown in FIG. 9 to illustrate that the methods described herein can be performed on a wide variety of information handling systems that operate in a networked environment. Types of information handling systems range from small handheld devices, such as handheld computer/mobile telephone 1010 to large mainframe systems, such as mainframe computer 1070. Examples of handheld computer 1010 include personal digital assistants (PDAs), personal entertainment devices, such as MP3 players, portable televisions, and compact disc players. Other examples of information handling systems include pen, or tablet, computer 1020, laptop, or notebook, computer 1030, workstation 1040, personal computer system 1050, and server 1060. Other types of information handling systems that are not individually shown in FIG. 10 are represented by information handling system 1080. As shown, the various information handling systems can be networked together using computer network 1000. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 10 depicts separate nonvolatile data stores (server 1060 utilizes nonvolatile data store 1065, mainframe computer 1070 utilizes nonvolatile data store 1075, and information handling system 1080 utilizes nonvolatile data store 1085). The nonvolatile data store can be a component that is external to the various information handling systems or can be internal to one of the information handling systems. In addition, removable nonvolatile storage device 945 can be shared among two or more information handling systems using various techniques, such as connecting the removable nonvolatile storage device 945 to a USB port or other connector of the information handling systems.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method comprising:

retrieving a design description and an assertion that both correspond to an electronic circuit design, wherein the assertion includes one or more assertion signal identifiers that correspond to one or more description signal points included in the design description;

mapping the one or more assertion signal identifiers to the one or more description signal points;

identifying a central propagation point corresponding to the one or more description signal points;

propagating the one or more description signal points towards the central propagation point, resulting in one or more boundary points;

creating a partitioned region from the design description based upon the one or more boundary points, wherein the partitioned region is a subset of the design description and describes a subset of the electronic circuit design;

compiling, by one or more processors, the partitioned region into a machine-recognizable format; and verifying the compiled partitioned region under one or more test conditions, wherein the verifying verifies the electronic circuit design.

2. The method of claim 1 wherein the propagating further comprises:

selecting one of the description signal points;

determining that a description module in the design description utilizes the selected description signal point as an output signal point and also includes an input signal point that is equivalent to the output signal point; and assigning the selected description signal point to the input signal point.

3. The method of claim 2 wherein the creating the partitioned region further comprises removing the description module from the partitioned region.

4. The method of claim 1 wherein:

the design description includes a plurality of state stages that each correspond to a clock cycle of the electronic circuit design; and for each of the one or more description signal points, the propagating is prohibited from crossing each of the plurality of state stages.

5. The method of claim 1 further comprising:

updating the assertion based upon the one or more boundary points, the updating including replacing one or more of the assertion signal identifiers with one or more different assertion signal identifiers that correspond to the one or more boundary points; and utilizing the updated assertion and the compiled partitioned region during the verification of the electronic circuit design.

6. The method of claim 1 further comprising:

defining a boundary area based upon the one or more boundary points;

identifying a condition statement included in the boundary area, wherein the condition statement includes a first input signal, a second input signal, and a condition selection signal that selects a first value on the first input signal or a second value the second input signal as an output value on an output signal;

determining that the condition selection signal selects the first input signal; and removing, while creating the partitioned region, one or more description statements from the design description that correspond to the second input signal in response to the determination.

7. The method of claim 6 further comprising:

recursively tracing the condition selection signal to one or more register inputs;

creating a symbolic expression that includes one or more register input identifiers corresponding to the one or more register inputs; and proving that the symbolic expression produces a constant condition value for the condition selection signal based upon one or more constraints corresponding to the one or more register inputs.

8. The method of claim 1 wherein the compiling further comprises:

creating a design database in the machine-recognizable format, the design database corresponding to the partitioned region, the assertion, and one or more constraints.

9. The method of claim 8 wherein the verifying further comprises:

determining that the assertion is true based upon the one or more constraints under each of the one or more test conditions.

10. The method of claim 1 further comprising:

creating a partitioned region group that includes a plurality of partitioned regions that each correspond to a plurality of assertions, the partitioned region included in the plurality of partitioned regions and the assertion included in the plurality of assertions;

compiling the partitioned region group into the machine-recognizable format; and verifying the compiled partitioned region group, the verifying further comprising:

determining that the plurality of assertions are true according to one or more constraints under each of the one or more test conditions.

11. The method of claim 1 wherein the design description is a register transfer level (RTL) file and wherein verifying the compiled partitioned region verifies the RTL file.

12. An information handling system comprising:

one or more processors;

one or more memories accessible by at least one of the processors;

a design partition generator executing on a first processor, included in the one or more processors, that is configured to retrieve a design description and an assertion both corresponding to an electronic circuit design from at least one of the memories, wherein the assertion includes one or more assertion signal identifiers that correspond to one or more description signal points included in the design description;

mapping logic included in the design partition generator configured to map the one or more assertion signal identifiers to the one or more description signal points and identify a central propagation point corresponding to the one or more description signal points;

propagation logic included in the design partition generator configured to propagate the one or more description signal points towards the central propagation point, resulting in one or more boundary points on which the partitioned region is based;

partition creation logic included in the design partition generator configured to create a partitioned region from the design description based upon the one or more boundary points, wherein the partitioned region is a subset of the design description;

a compiler module executing on a second processor, included in the one or more processors, that is configured to receive the partitioned region from the design partition generator and compile the partitioned region into a machine-recognizable format; and a verification module executing on a third processor configured to receive the compiled partitioned region from the compiler module and verify the compiled partitioned region under one or more test conditions, wherein the verifying verifies the electronic circuit design.

13. The information handling system of claim 12 further comprising:

the propagation logic included in the design partition generator further configured to select one of the description signal points and determine that a description module in the design description utilizes the selected description signal point as an output signal point and also includes an input signal point that is equivalent to the output signal point; and the propagation logic included in the design partition generator further configured to assign the selected description signal point to the input signal point and remove the description module from the partitioned region.

14. The information handling system of claim 12 further comprising:

assertion update logic included in the design partition generator configured to update the assertion based upon the one or more boundary points, the updating including replacing one or more of the assertion signal identifiers with one or more different assertion signal identifiers that correspond to the one or more boundary points, the updated assertion and the compiled partitioned region utilized during the verification of the electronic circuit design.

15. The information handling system of claim 12 further comprising:

boundary definition logic included in the design partition generator configured to define a boundary area based upon the one or more boundary points;

identification logic included in the design partition generator configured to identify a condition statement included in the boundary area, wherein the condition statement includes a first input signal, a second input signal, and a condition selection signal that selects a first value on the first input signal or a second value the second input signal as an output value on an output signal; and condition selection logic included in the design partition generator configured to create a symbolic expression that includes one or more register input identifiers corresponding to the one or more register inputs and determines the condition selection signal selects the first input signal and removes, while creating the partitioned region, one or more description statements from the design description that correspond to the second input signal.

16. The information handling system of claim 12 further comprising:

the compiler module configured to create a design database in the machine-recognizable format that includes the partitioned region, the assertion, and one or more constraints;

the verification module configured to receive the design database from the compiler module and determine that the assertion is true based upon the one or more constraints under each of the one or more test conditions.

17. A computer program product stored in a computer readable storage device, comprising computer program code that, when executed by an information handling system, causes the information handling system to perform actions comprising:

retrieving a design description and an assertion that both correspond to an electronic circuit design, wherein the assertion includes one or more assertion signal identifiers that correspond to one or more description signal points included in the design description;

mapping the one or more assertion signal identifiers to the one or more description signal points;

identifying a central propagation point corresponding to the one or more description signal points;

propagating the one or more description signal points towards the central propagation point, resulting in one or more boundary points;

creating a partitioned region from the design description based upon the one or more boundary points, wherein the partitioned region is a subset of the design description and describes a subset of the electronic circuit design;

compiling the partitioned region into a machine-recognizable format; and verifying the compiled partitioned region under one or more test conditions, wherein the verifying verifies the electronic circuit design.

18. The computer program product of claim 17 wherein the design description includes a plurality of state stages that each correspond to a clock cycle of the electronic circuit design and, for each of the one or more description signal points, the propagating is prohibited from crossing each of the plurality of state stages, and wherein the computer readable storage medium stores additional instructions that, when executed by the information handling system, cause the information handling system to perform additional actions comprising:

selecting one of the description signal points;

determining that a description module in the design description utilizes the selected description signal point as an output signal point and also includes an input signal point that is equivalent to the output signal point; and assigning the selected description signal point to the input signal point.

* * * * *